United States Patent
Akimoto et al.

(10) Patent No.: US 9,882,099 B2
(45) Date of Patent: Jan. 30, 2018

(54) SEMICONDUCTOR LIGHT EMITTING DEVICE

(71) Applicant: Kabushiki Kaisha Toshiba, Minato-ku (JP)

(72) Inventors: Yosuke Akimoto, Nonoichi (JP); Akihiro Kojima, Nonoichi (JP); Miyoko Shimada, Hakusan (JP); Hideyuki Tomizawa, Kanazawa (JP); Hideto Furuyama, Yokohama (JP); Yoshiaki Sugizaki, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/061,605

(22) Filed: Mar. 4, 2016

(65) Prior Publication Data
US 2017/0062667 A1 Mar. 2, 2017

(30) Foreign Application Priority Data
Aug. 28, 2015 (JP) ................................. 2015-169604

(51) Int. Cl.
*H01L 33/50* (2010.01)

(52) U.S. Cl.
CPC .......... *H01L 33/504* (2013.01); *H01L 33/505* (2013.01)

(58) Field of Classification Search
None
See application file for complete search history.

(56) References Cited

U.S. PATENT DOCUMENTS

| | | | |
|---|---|---|---|
| 8,110,421 B2 | 2/2012 | Sugizaki et al. | |
| 9,184,357 B2 | 11/2015 | Sugizaki et al. | |
| 2007/0001182 A1* | 1/2007 | Schardt | C09K 11/02 257/98 |
| 2012/0170275 A1* | 7/2012 | Hikmet | G02B 6/005 362/260 |
| 2012/0235177 A1 | 9/2012 | Naka | |
| 2012/0235184 A1 | 9/2012 | Koizumi et al. | |
| 2012/0277896 A1 | 11/2012 | Uekita et al. | |
| 2013/0082294 A1 | 4/2013 | Nakayama et al. | |
| 2013/0193839 A1 | 8/2013 | Kobayashi | |
| 2014/0167605 A1* | 6/2014 | Park | H05B 33/10 313/506 |
| 2015/0084083 A1* | 3/2015 | Hirosaki | C09K 11/7734 257/98 |
| 2016/0027982 A1 | 1/2016 | Sugizaki et al. | |

(Continued)

*Primary Examiner* — Abul Kalam
(74) *Attorney, Agent, or Firm* — Oblon, McClelland, Maier & Neustadt, L.L.P.

(57) ABSTRACT

According to one embodiment, a semiconductor light-emitting device includes a semiconductor layer including a light emitting layer; and a phosphor layer provided on the semiconductor layer. The phosphor layer includes a plurality of phosphors, $-0.05 < A \times (AR) + B \times (Np) + C < 0.05$ being satisfied for $-0.149055 - (3 \times 0.011797) \leq$ constant $A \leq -0.149055 + (3 \times 0.011797)$, $-0.000192 - (3 \times 0.00002461) \leq$ constant $B \leq -0.000192 + (3 \times 0.00002461)$, and $0.0818492 - (3 \times 0.005708) \leq$ constant $C \leq 0.0818492 + (3 \times 0.005708)$. AR is a ratio of a thickness of the phosphor layer to a width of the phosphor layer, and Np is a number of the plurality of phosphors.

18 Claims, 7 Drawing Sheets

(56) References Cited

U.S. PATENT DOCUMENTS

2016/0181484 A1\* 6/2016 Roh .................. H01L 33/504
                                                         257/88
2016/0264863 A1\* 9/2016 Liu ................... C09K 11/0883

\* cited by examiner

US 9,882,099 B2

SEMICONDUCTOR LIGHT EMITTING DEVICE

CROSS-REFERENCE TO RELATED APPLICATION

This application is based upon and claims the benefit of priority from Japanese Patent Application No. 2015-169604, filed on Aug. 28, 2015; the entire contents of which are incorporated herein by reference.

FIELD

Embodiments described herein relate generally to a semiconductor light emitting device.

BACKGROUND

A semiconductor light emitting device having a chip size package structure has been proposed in which a phosphor layer and multiple phosphors are provided on one surface side of a semiconductor layer including a light emitting layer; and interconnect layers, external terminals, and a resin layer are provided on the other surface (mounting surface) side.

Degradation of the optical characteristics may be problematic due to the conditions of the phosphor layer and the multiple phosphors.

DETAILED DESCRIPTION

Figure 1:
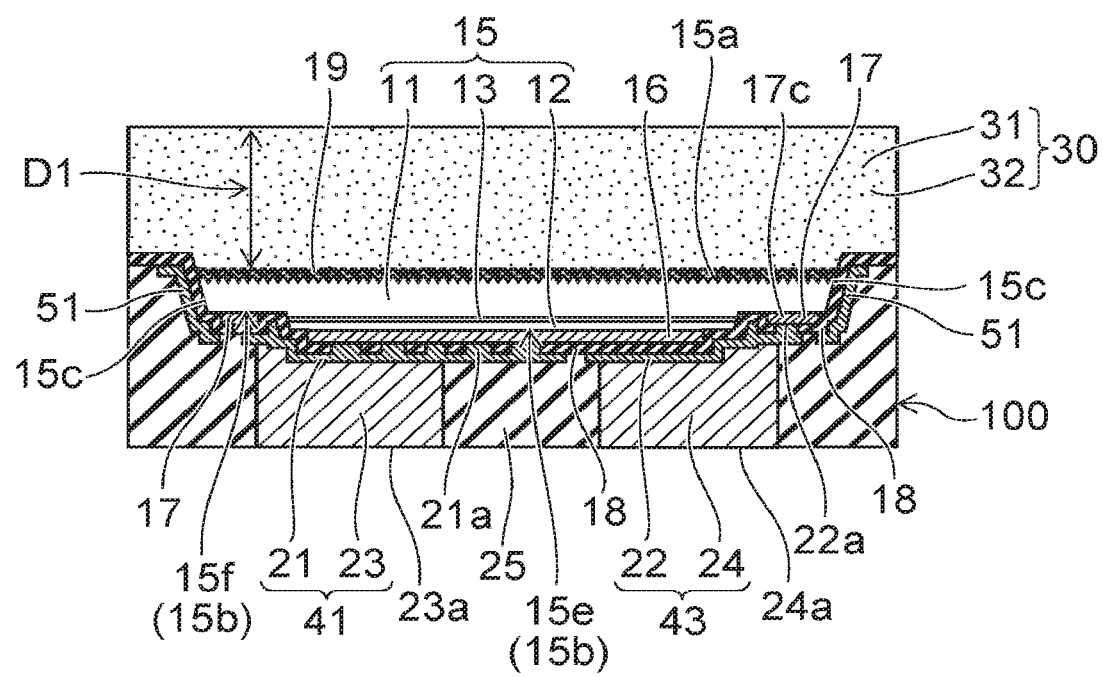
FIG. 1 is a schematic cross-sectional view of a semiconductor light emitting device of an embodiment.

According to one embodiment, a semiconductor light-emitting device includes a semiconductor layer including a light emitting layer; and a phosphor layer provided on the semiconductor layer. The phosphor layer includes a plurality of phosphors, $-0.05 < A \times (AR) + B \times (Np) + C < 0.05$ being satisfied for $-0.149055 - (3 \times 0.011797) \le \text{constant } A \le -0.149055 + (3 \times 0.011797)$, $-0.000192 - (3 \times 0.00002461) \le \text{constant } B \le -0.000192 + (3 \times 0.00002461)$, and $0.0818492 - (3 \times 0.005708) \le \text{constant } C \le 0.0818492 + (3 \times 0.005708)$. AR is a ratio of a thickness of the phosphor layer to a width of the phosphor layer, and Np is a number of the plurality of phosphors.

Embodiments are described below with reference to the drawings. Note that in the drawings, the same components are denoted by the same reference numerals and signs.

FIG. 1 is a schematic cross-sectional view of a semiconductor light emitting device of the embodiment.

Figure 2A:
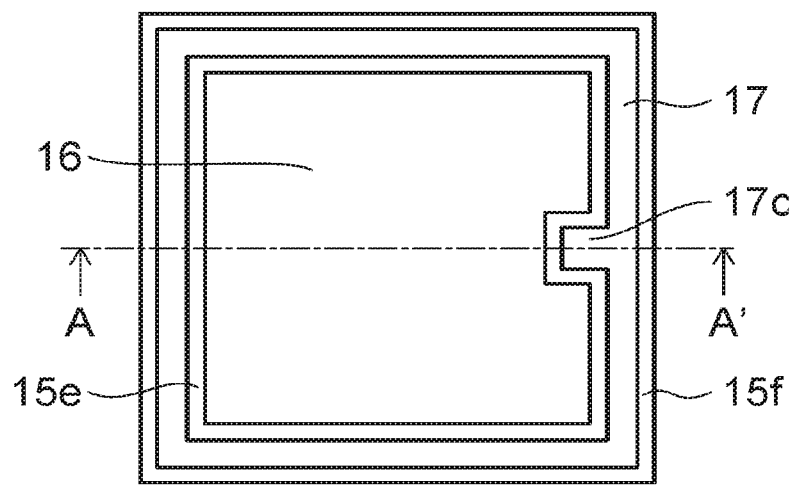
FIG. 2A is a schematic plan view showing an example of a planar layout of the semiconductor light emitting device of the embodiment.

FIG. 2A is a schematic plan view showing an example of a planar layout of a p-side electrode 16 and an n-side electrode of the semiconductor light emitting device of the embodiment. FIG. 1 corresponds to an A-A' cross section of FIG. 2A. FIG. 2A corresponds to a drawing in which a second side 15b of a semiconductor layer 15 is viewed without interconnect units 41 and 43, a resin layer 25, an insulating film 18, and a reflective film 51 of FIG. 1.

Figure 2B:
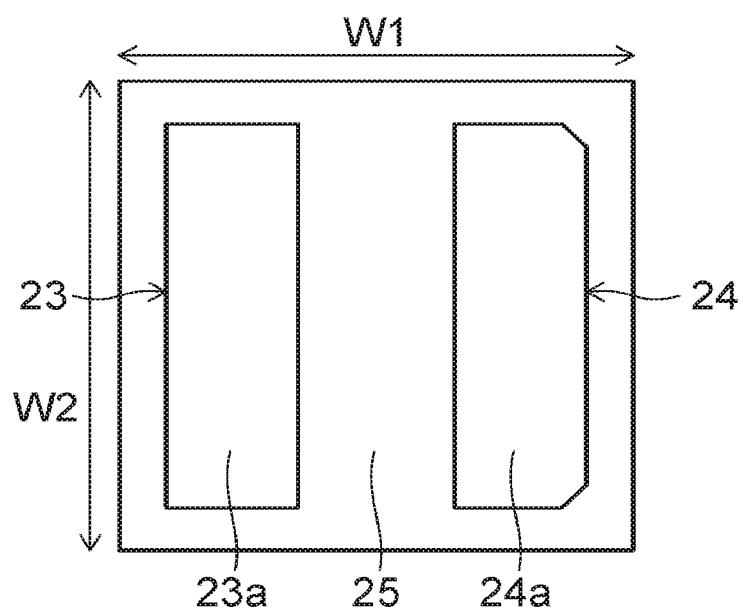
FIG. 2B is a schematic plan view showing an example of the mounting surface of the semiconductor light emitting device of the embodiment.

FIG. 2B is a schematic plan view showing an example of the mounting surface of the semiconductor light emitting device of the embodiment (the lower surface of the semiconductor light emitting device of FIG. 1).

The semiconductor light emitting device of the embodiment includes the semiconductor layer 15 including a light emitting layer 13. The semiconductor layer 15 has a first side 15a, and a second side 15b on the side opposite to the first side 15a.

The second side 15b of the semiconductor layer 15 includes a portion (a light emitting region) 15e that includes the light emitting layer 13, and a portion (a non-light emitting region) 15f that does not include the light emitting layer 13. The portion 15e that includes the light emitting layer 13 is the portion of the semiconductor layer 15 where the light emitting layer 13 is stacked. The portion 15f that does not include the light emitting layer 13 is the portion of the semiconductor layer 15 where the light emitting layer 13 is not stacked. The portion 15e that includes the light emitting layer 13 is the region of the stacked structure where the light emitted by the light emitting layer 13 is extractable to the outside.

On the second side 15b, the p-side electrode 16 is provided as a first electrode on the portion 15e including the light emitting layer 13; and the n-side electrode 17 is provided as a second electrode on the portion 15f not including the light emitting layer.

In the example shown in FIG. 2A, the portion 15f that does not include the light emitting layer 13 surrounds the portion 15e including the light emitting layer 13; and the n-side electrode 17 surrounds the p-side electrode 16.

A current is supplied to the light emitting layer 13 via the p-side electrode 16 and the n-side electrode 17; and the light emitting layer 13 emits light. Then, the light that is radiated from the light emitting layer 13 is emitted outside the semiconductor light emitting device from the first side 15a.

As shown in FIG. 1, a support body 100 is provided on the second side 15b of the semiconductor layer 15. The light emitting element that includes the semiconductor layer 15, the p-side electrode 16, and the n-side electrode 17 is supported by the support body 100 provided on the second side 15b.

A phosphor layer 30 (an optical layer) that provides the desired optical characteristics to the light emitted by the semiconductor light emitting device is provided on the first side 15a of the semiconductor layer 15. The phosphor layer 30 is transmissive to the light radiated by the light emitting layer 13.

For example, an insulating layer 19 (a transparent layer) that is adhesive is provided between the phosphor layer 30 and the semiconductor layer 15. For example, the phosphor layer 30 may contact the semiconductor layer 15.

The phosphor layer 30 includes multiple phosphors 31 that have particle configurations. The phosphors 31 are excited by the light radiated by the light emitting layer 13 and radiate light of a wavelength different from that of the radiated light.

The multiple phosphors 31 are formed in one body with a binder 32. The binder 32 transmits the light radiated by the light emitting layer 13 and the light radiated by the phosphors 31. Herein, "transmitting" is not limited to the transmittance being 100% and includes the case where a portion of the light is absorbed.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 include, for example, gallium nitride.

The first semiconductor layer 11 includes, for example, a foundation buffer layer and an n-type GaN layer. The second semiconductor layer 12 includes, for example, a p-type GaN layer. The light emitting layer 13 includes a material that emits blue light, violet light, bluish-violet light, ultraviolet light, etc. The light emission peak wavelength of the light emitting layer 13 is, for example, 430 to 470 nm.

The second side 15b of the semiconductor layer 15 is patterned into an uneven configuration. The protrusion on the second side 15b is the portion 15e that includes the light emitting layer 13; and the recess on the second side 15b is the portion 15f that does not include the light emitting layer 13. The surface of the portion 15e including the light emitting layer 13 is the surface of the second semiconductor layer 12; and the p-side electrode 16 is provided on the surface of the second semiconductor layer 12. The surface of the portion 15f not including the light emitting layer 13 is the surface of the first semiconductor layer 11; and the n-side electrode 17 is provided on the surface of the first semiconductor layer 11.

On the second side 15b of the semiconductor layer 15, the surface area of the portion 15e including the light emitting layer 13 is greater than the surface area of the portion 15f not including the light emitting layer 13. Also, the surface area of the p-side electrode 16 provided on the surface of the portion 15e including the light emitting layer 13 is greater than the surface area of the n-side electrode 17 provided on the surface of the portion 15f not including the light emitting layer 13. Thereby, a wide light emitting surface is obtained; and the light output can be high.

As shown in FIG. 2A, the n-side electrode 17 includes, for example, four straight portions; and a contact portion 17c that protrudes in the width direction of the straight portion is provided in one straight portion of the four straight portions. A via 22a of an n-side interconnect layer 22 is connected to the surface of the contact portion 17c as shown in FIG. 1.

As shown in FIG. 1, the second side 15b of the semiconductor layer 15, the p-side electrode 16, and the n-side electrode 17 are covered with the insulating film 18. The insulating film 18 is, for example, an inorganic insulating film such as a silicon oxide film, etc. The insulating film 18 is provided also on the side surface of the light emitting layer 13 and the side surface of the second semiconductor layer 12 and covers these side surfaces.

The insulating film 18 is provided also on a side surface 15c of the semiconductor layer 15 (the side surface of the first semiconductor layer 11) that is continuous from the first side 15a; and the insulating film 18 covers the side surface 15c.

The insulating film 18 is further provided in the chip outer circumferential portion at the periphery of the side surface 15c of the semiconductor layer 15. The insulating film 18 that is provided on the chip outer circumferential portion extends in a direction away from the side surface 15c on the first side 15a.

A p-side interconnect layer 21 as a first interconnect layer and the n-side interconnect layer 22 as a second interconnect layer are provided to be separated from each other on the insulating film 18 on the second side 15b. Multiple first openings that communicate with the p-side electrode 16 and a second opening that communicates with the contact portion 17c of the n-side electrode 17 are made in the insulating film 18. The first openings may be one large opening.

The p-side interconnect layer 21 is provided in the interiors of the first openings and on the insulating film 18. The p-side interconnect layer 21 is electrically connected to the p-side electrode 16 by vias 21a provided inside the first openings.

The n-side interconnect layer 22 is provided in the interior of the second opening and on the insulating film 18. The n-side interconnect layer 22 is electrically connected to the contact portion 17c of the n-side electrode 17 by the via 22a provided inside the second opening.

The p-side interconnect layer 21 and the n-side interconnect layer 22 spread over the insulating film 18 and occupy the greater part of the region on the second side 15b. The p-side interconnect layer 21 is connected to the p-side electrode 16 by the multiple vias 21a.

A reflective film 51 (a metal film) covers the side surface 15c of the semiconductor layer 15 with the insulating film 18 interposed. The reflective film 51 does not contact the side surface 15c and is not electrically connected to the semiconductor layer 15. The reflective film 51 is separated from the p-side interconnect layer 21 and the n-side interconnect layer 22. The reflective film 51 is reflective to the light radiated by the light emitting layer 13 and the light radiated by the phosphors 31.

The reflective film 51, the p-side interconnect layer 21, and the n-side interconnect layer 22 include, for example, a copper film formed simultaneously on a common metal film by plating.

The reflective film 51 may be formed of a metal film at the chip outer circumferential portion adjacent to the side surface 15c of the semiconductor layer 15 without forming the plating film (the copper film) on the metal film. The reflective film 51 has a high reflectance for the light radiated by the light emitting layer 13 and the light radiated by the phosphors 31 by including at least an aluminum film.

Because the foundation metal film (the aluminum film) remains also under the p-side interconnect layer 21 and the n-side interconnect layer 22, the aluminum film is formed to spread in the region of the greater part of the second side 15b. Thereby, the amount of the light toward the phosphor layer 30 side can be increased.

A p-type metal pillar 23 is provided as a first metal pillar on the surface of the p-side interconnect layer 21 on the side opposite to the semiconductor layer 15. The p-side interconnect unit 41 is formed of the p-side interconnect layer 21 and the p-type metal pillar 23.

An n-side metal pillar 24 is provided as a second metal pillar on the surface of the n-side interconnect layer 22 on the side opposite to the semiconductor layer 15. The n-side interconnect unit 43 is formed of the n-side interconnect layer 22 and the n-side metal pillar 24.

The resin layer 25 is provided as a second insulating film between the p-side interconnect unit 41 and the n-side interconnect unit 43. The resin layer 25 is provided between the p-type metal pillar 23 and the n-side metal pillar 24 to contact the side surface of the p-type metal pillar 23 and the side surface of the n-side metal pillar 24. In other words, the resin layer 25 is filled between the p-type metal pillar 23 and the n-side metal pillar 24.

The resin layer 25 is provided also between the p-side interconnect layer 21 and the n-side interconnect layer 22, between the p-side interconnect layer 21 and the reflective film 51, and between the n-side interconnect layer 22 and the reflective film 51.

The resin layer 25 is provided at the periphery of the p-type metal pillar 23 and the periphery of the n-side metal pillar 24 and covers the side surface of the p-type metal pillar 23 and the side surface of the n-side metal pillar 24.

The resin layer 25 is provided also in the chip outer circumferential portion adjacent to the side surface 15c of the semiconductor layer 15 and covers the reflective film 51.

The end portion (the surface) of the p-type metal pillar 23 on the side opposite to the p-side interconnect layer 21 is exposed from the resin layer 25 and functions as a p-side external terminal 23a that is connectable to an external circuit such as a mounting substrate, etc. The end portion (the surface) of the n-side metal pillar 24 on the side opposite to the n-side interconnect layer 22 is exposed from the resin layer 25 and functions as an n-side external terminal 24a that is connectable to an external circuit such as a mounting substrate, etc. For example, the p-side external terminal 23a and the n-side external terminal 24a are bonded to a land pattern of a mounting substrate via solder or an electrically conductive bonding agent.

As shown in FIG. 2B, the p-side external terminal 23a and the n-side external terminal 24a are formed to be arranged to be separated from each other in the same surface of the resin layer 25. For example, the p-side external terminal 23a is formed in a rectangular configuration; and the n-side external terminal 24a is formed in a configuration in which two corners are cut away from a rectangle having the same size as the rectangle of the p-side external terminal 23a. Thereby, the polarities of the external terminals can be discriminated. For example, the n-side external terminal 24a may have the rectangular configuration; and the p-side external terminal 23a may have the configuration in which the corners of the rectangle are cut away.

The spacing between the p-side external terminal 23a and the n-side external terminal 24a is wider than the spacing between the p-side interconnect layer 21 and the n-side interconnect layer 22 on the insulating film 18. The spacing between the p-side external terminal 23a and the n-side external terminal 24a is wider than the spreading of the solder when mounting. Thereby, shorts between the p-side external terminal 23a and the n-side external terminal 24a via the solder can be prevented.

Conversely, the spacing between the p-side interconnect layer 21 and the n-side interconnect layer 22 can be set to be narrow to the limit of the process. Therefore, the surface area of the p-side interconnect layer 21 and the contact surface area between the p-side interconnect layer 21 and the p-type metal pillar 23 can be enlarged. Thereby, the dissipation of the heat of the light emitting layer 13 can be promoted.

The surface area of the p-side interconnect layer 21 contacting the p-side electrode 16 by the multiple vias 21a is greater than the surface area of the n-side electrode 17 contacting the n-side interconnect layer 22 by the via 22a. Thereby, the distribution of the current flowing in the light emitting layer 13 can be uniform.

The surface area of the n-side interconnect layer 22 spreading over the insulating film 18 can be greater than the surface area of the n-side electrode 17. Also, the surface area of the n-side metal pillar 24 provided on the n-side interconnect layer 22 (the surface area of the n-side external terminal 24a) can be wider than the n-side electrode 17. Thereby, it is possible to set the surface area of the n-side electrode 17 to be small while ensuring a surface area of the n-side external terminal 24a that is sufficient for high mounting reliability. In other words, it is possible to improve light output by reducing the surface area of the portion 15f of the semiconductor layer 15 not including the light emitting layer 13 and by increasing the surface area of the portion 15e of the semiconductor layer 15 including the light emitting layer 13.

The first semiconductor layer 11 is electrically connected to the n-side metal pillar 24 via the n-side electrode 17 and the n-side interconnect layer 22. The second semiconductor layer 12 is electrically connected to the p-type metal pillar 23 via the p-side electrode 16 and the p-side interconnect layer 21.

The thickness of the p-type metal pillar 23 (the thickness in a direction connecting the p-side interconnect layer 21 and the p-side external terminal 23a) is thicker than the thickness of the p-side interconnect layer 21. The thickness of the n-side metal pillar 24 (the thickness in a direction connecting the n-side interconnect layer 22 and the n-side external terminal 24a) is thicker than the thickness of the n-side interconnect layer 22. The thicknesses of the p-type metal pillar 23, the n-side metal pillar 24, and the resin layer 25 are thicker than the semiconductor layer 15.

The aspect ratios (the ratios of the thicknesses to the planar sizes) of the metal pillars 23 and 24 may be equal to, greater than, or less than 1. In other words, the metal pillars 23 and 24 may be thicker or thinner than their planar sizes.

The thickness of the support body 100 including the p-side interconnect layer 21, the n-side interconnect layer 22, the p-type metal pillar 23, the n-side metal pillar 24, and the resin layer 25 is thicker than the thickness of the light emitting element (the LED chip) including the semiconductor layer 15, the p-side electrode 16, and the n-side electrode 17.

For example, the semiconductor layer 15 is formed by epitaxial growth on a substrate. The substrate is removed after forming the support body 100; and the semiconductor layer 15 does not include the substrate on the first side 15a. The semiconductor layer 15 is supported not by a substrate having a rigid plate configuration but by the support body 100 made of a compound body of the metal pillars 23 and 24 and the resin layer 25.

For example, copper, gold, nickel, silver, etc., may be used as the materials of the p-side interconnect unit 41 and the n-side interconnect unit 43. Among these, good thermal conductivity, high migration resistance, and adhesion with insulating materials can be improved when copper is used.

The resin layer 25 reinforces the p-type metal pillar 23 and the n-side metal pillar 24. It is desirable for the resin layer 25 to have a coefficient of thermal expansion near to or the same as that of the mounting substrate. Examples of such a resin layer 25 include, for example, a resin including mainly an epoxy resin, a resin including mainly a silicone resin, and a resin including mainly a fluorocarbon resin.

The resin that is the base of the resin layer 25 includes a light-shielding material (a light absorbing agent, a light reflecting agent, a light scattering agent, etc.); and the resin layer 25 is light-shielding to the light emitted by the light emitting layer 13. Thereby, light leakage from the side surface of the support body 100 and the mounting surface side can be suppressed.

In the thermal cycle when mounting the semiconductor light emitting device, the p-side external terminal 23a and the n-side external terminal 24a are bonded to the lands of the mounting substrate; and stress caused by the solder, etc., is applied to the semiconductor layer 15. The p-type metal pillar 23, the n-side metal pillar 24, and the resin layer 25 absorb and relax the stress. In particular, the stress relieving effect can be increased by using the resin layer 25 that is more flexible than the semiconductor layer 15 as a portion of the support body 100.

The reflective film 51 is separated from the p-side interconnect unit 41 and the n-side interconnect unit 43. Therefore, the stress that is applied to the p-type metal pillar and the n-side metal pillar 24 when mounting is not transmitted to the reflective film 51. Accordingly, peeling of the reflective film 51 can be suppressed. Also, the stress that is applied to the side surface 15c side of the semiconductor layer 15 can be suppressed.

For example, the substrate that is used to form the semiconductor layer 15 is removed from the semiconductor layer 15. Thereby, the semiconductor light emitting device is thinner. Also, by the removal of the substrate, a micro unevenness can be formed on the first side 15a of the semiconductor layer 15; and the light extraction efficiency is increased.

For example, the micro unevenness is formed by performing wet etching of the first side 15a using an alkaline solution. Thereby, the total internal reflection component at the first side 15a is reduced; and the light extraction efficiency can be increased.

After the substrate is removed, the phosphor layer 30 is formed on the first side 15a with the insulating layer 19 interposed. The insulating layer 19 functions as an adhesion layer that increases the adhesion between the semiconductor layer 15 and the phosphor layer 30 and is, for example, a silicon oxide film or a silicon nitride film. The thickness of the insulating layer 19 is, for example, more than 0 µm but not more than 10 µm.

The phosphor layer 30 has a structure in which the multiple phosphors 31 having the particle configurations are dispersed in the binder 32. The binder 32 may include, for example, a silicone resin.

The phosphor layer 30 is formed also on the chip outer circumferential portion at the periphery of the side surface 15c of the semiconductor layer 15. Accordingly, the planar size of the phosphor layer 30 is larger than the planar size of the semiconductor layer 15. At the chip outer circumferential portion, the phosphor layer 30 is provided on the insulating film (e.g., the silicon oxide film) 18. For example, the width of the phosphor layer 30 provided on the insulating film 18 is not less than 10 µm and not more than 30 µm.

The "planar size" described above is the planar surface area when the direction of the support body 100 is viewed from the semiconductor layer 15. The "width of the phosphor layer 30" described above is the distance from the side surface 15c of the semiconductor layer 15 to the chip outer circumferential portion.

The phosphor layer 30 is limited to being formed on the first side 15a of the semiconductor layer 15 and the region adjacent to the side surface 15c of the semiconductor layer 15 and is not formed to extend around to the second side 15b of the semiconductor layer 15, the peripheries of the metal pillars 23 and 24, or the side surface of the support body 100. The side surface of the phosphor layer 30 is aligned with the side surface of the support body 100 (the side surface of the resin layer 25). In other words, widths W1 and W2 shown in FIG. 2B are widths of the phosphor layer 30. For example, the width W1 may be equal to the width W2 or wider than the width W2.

In other words, the semiconductor light emitting device of the embodiment is an extremely small semiconductor light emitting device having a chip size package structure. Therefore, for example, the degrees of freedom of light fixture design are increased when applying to light fixtures for illumination, etc.

The phosphor layer 30 is not formed unnecessarily on the mounting surface side where the light is not extracted to the outside; and a cost reduction is realized. Even in the case where there is no substrate on the first side 15a, the heat of the light emitting layer 13 can be dissipated to the mounting substrate side via the p-side interconnect layer 21 and the n-side interconnect layer 22 that spread on the second side 15b; and the heat dissipation is excellent despite being small.

For example, for a general flip chip mount, a phosphor layer is formed to cover the entire chip after the LED chip is mounted to the mounting substrate with bumps, etc., interposed. Or, a resin is under-filled between the bumps. Conversely, according to the embodiment, the resin layer 25 that is different from the phosphor layer 30 is provided at the periphery of the p-type metal pillar 23 and the periphery of the n-side metal pillar 24 in a state prior to the mounting; and characteristics suited to stress relief can be provided to the mounting surface side. Because the resin layer 25 already is provided on the mounting surface side, the underfill after the mounting is unnecessary.

Layers designed with priority on light extraction efficiency, color conversion efficiency, light distribution characteristics, etc., are provided on the first side 15a; and layers that have priority on stress relief when mounting and characteristics of the support body used instead of the substrate are provided on the mounting surface side. For example, the resin layer 25 has a structure in which a filler such as silica particles or the like is filled at high density into the resin used as the base; and the resin layer 25 is adjusted to have the appropriate hardness as the support body.

The light that is radiated from the light emitting layer 13 on the first side 15a is incident on the phosphor layer 30; a portion of the light excites the phosphors 31; and, for example, white light is obtained as a mixed light of the light of the light emitting layer 13 and the light of the phosphors 31.

Here, in the case where there is a substrate on the first side 15a, light may leak to the outside from the side surface of the substrate without being incident on the phosphor layer 30. In other words, light of the light emitting layer 13 that has a strong tint leaks from the side surface of the substrate which may cause color breakup and uneven color such as a phenomenon in which a ring of blue light is viewed at the outer edge side when the phosphor layer 30 is viewed from the upper surface, etc.

Conversely, according to the embodiment, because there is no substrate between the first side 15a and the phosphor layer 30, color breakup and uneven color due to the light of the light emitting layer 13 that has a strong tint leaking from the substrate side surface can be prevented.

Further, according to the embodiment, the reflective film 51 is provided on the side surface 15c of the semiconductor layer 15 with the insulating film 18 interposed. The light that is traveling from the light emitting layer 13 toward the side surface 15c of the semiconductor layer 15 is reflected by the reflective film 51 and does not leak to the outside. Therefore, color breakup and uneven color due to the light leakage from the side surface side of the semiconductor light emitting device can be prevented in addition to the feature of having no substrate on the first side 15a.

The side surface 15c of the semiconductor layer 15 where the reflective film 51 is provided is tilted with respect to the first side 15a (the flat portion of the first side 15a). Also, the side surface 15c is tilted with respect to the second side 15b. Accordingly, the reflective surface that is provided on the side surface is tilted with respect to the first side 15a and the second side 15b. The extension line of the side surface 15c is tilted with respect to the interface between the phosphor layer 30 and the insulating film 18 at an obtuse angle.

The insulating film 18 that is provided between the reflective film 51 and the side surface 15c of the semiconductor layer 15 prevents the diffusion of the metal included in the reflective film 51 into the semiconductor layer 15. Thereby, for example, metal contamination of the GaN of the semiconductor layer 15 can be prevented; and degradation of the semiconductor layer 15 can be prevented.

The insulating film 18 that is provided between the reflective film 51 and the phosphor layer 30 and between the resin layer 25 and the phosphor layer 30 increases the adhesion between the reflective film 51 and the phosphor layer 30 and the adhesion between the resin layer 25 and the phosphor layer 30.

The insulating film 18 is, for example, an inorganic insulating film such as a silicon oxide film, a silicon nitride film, etc. In other words, the first side 15a and the second side 15b of the semiconductor layer 15, the side surface 15c of the first semiconductor layer 11, the side surface of the second semiconductor layer 12, and the side surface of the light emitting layer 13 are covered with inorganic insulating films. The inorganic insulating films surround the semiconductor layer 15 and shield the semiconductor layer 15 from metals, moisture, etc.

Optical characteristics of the semiconductor light emitting device of the embodiment will now be described with reference to FIG. 3A to FIG. 5.

Figure 3A:
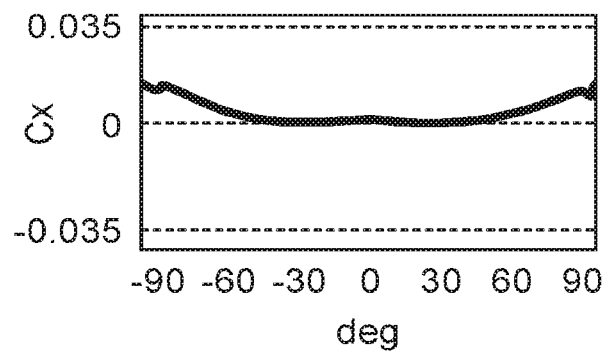
FIG. 3A to FIG. 3C are graphs of the chromaticity of the semiconductor light emitting device.
Figure 3B:
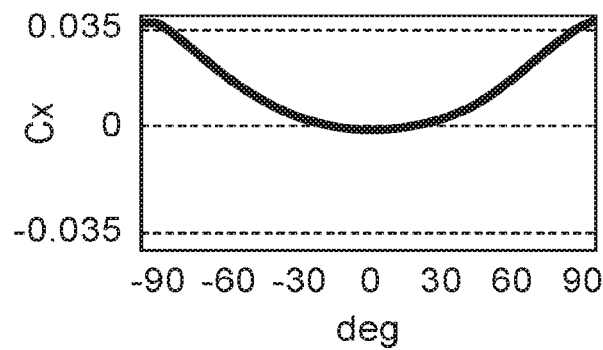
Figure 3C:
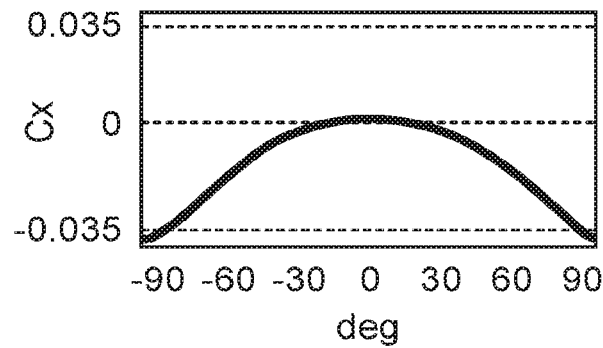

FIG. 3A to FIG. 3C are graphs of the chromaticity of the semiconductor light emitting device.

In FIG. 3A to FIG. 3C, the horizontal axis is the irradiation angle (deg). 0 deg is at the front side parallel to the surface of the first side 15a of the semiconductor light emitting device; and 90 deg and −90 deg are at the side surface sides perpendicular to the surface of the first side 15a of the semiconductor light emitting device.

In FIG. 3A to FIG. 3C, the vertical axis is a chromaticity Cx. This is a relative value in which the chromaticity at 0 deg is used as the reference of 0.00. For example, in the case where the absolute value of the chromaticity is large, the shift of the hue of the semiconductor light emitting device is large; and color breakup may occur.

As shown in FIG. 3A, the chromaticity Cx is greater than −0.035 and less than 0.035 for each irradiation angle. In such a case, the shift of the hue of the semiconductor light emitting device is small; and, for example, white light is viewed for the entirety when the semiconductor light emitting device is viewed from the upper surface.

As shown in FIG. 3B, the chromaticity Cx increases as the irradiation angle increases; and the chromaticity Cx at 90 deg and −90 deg is 0.035 or more. In such a case, the shift of the hue of the semiconductor light emitting device is large; and, for example, a ring of yellow light (a yellow ring) is viewed at the outer edge side when the semiconductor light emitting device is viewed from the upper surface.

As shown in FIG. 3C, the chromaticity Cx decreases as the irradiation angle increases; and the chromaticity Cx is not more than −0.035 at 90 deg and −90 deg. In such a case, the shift of the hue of the semiconductor light emitting device is large; and, for example, a blue ring (blue breakup) is viewed at the outer edge side when the semiconductor light emitting device is viewed from the upper surface.

A chromaticity Cy also has a trend similar to that of the chromaticity Cx, and a description is therefore omitted.

Figure 4:
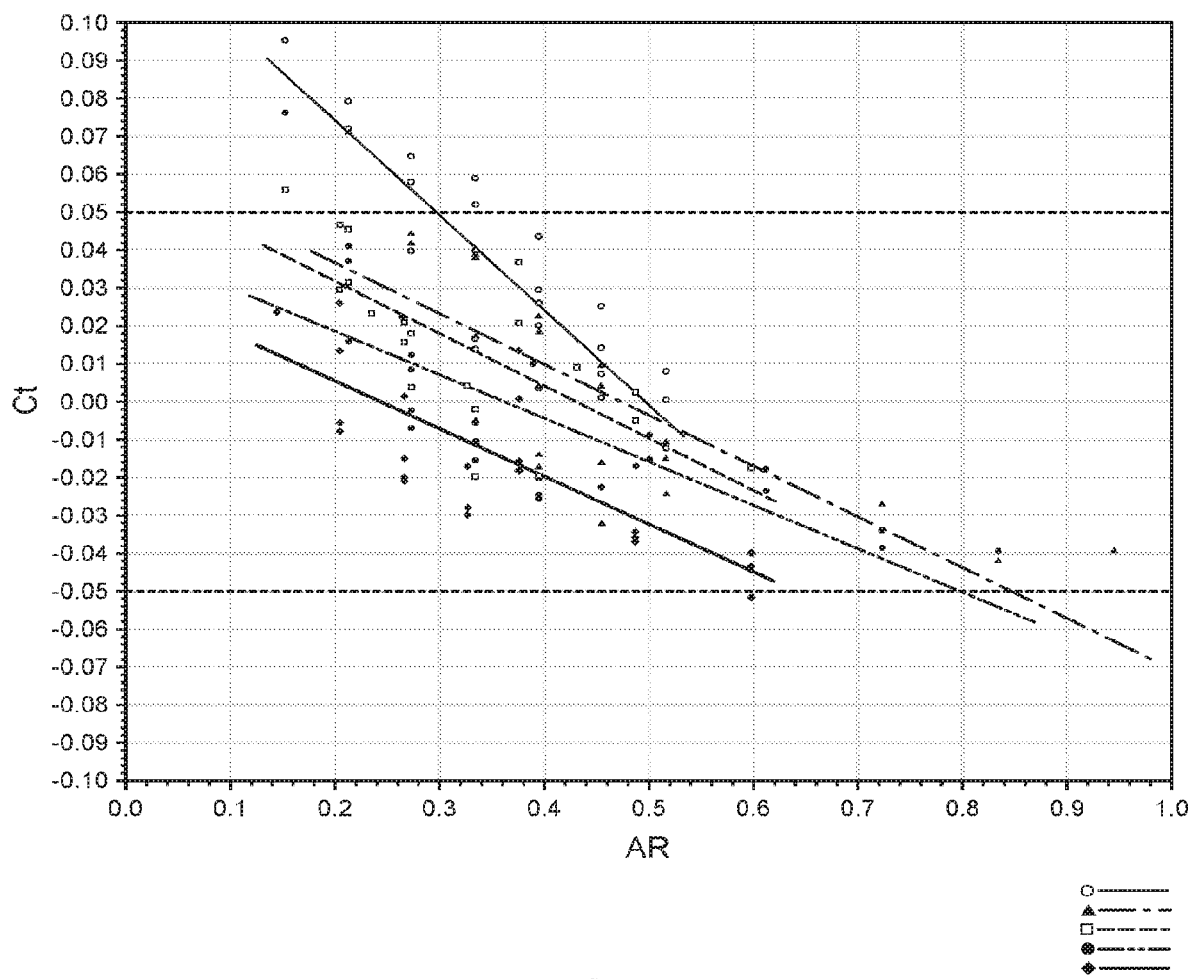
FIG. 4 is a graph of the chromaticity of the semiconductor light emitting device.

FIG. 4 is a graph of measurement results of the chromaticity of the semiconductor light emitting device.

In FIG. 4, the horizontal axis is an aspect ratio AR of the phosphor layer 30; and the vertical axis is a chromaticity Ct.

The aspect ratio AR is expressed by Formula (1) using a thickness D1 (μm) of the phosphor layer 30 and the width W1 (μm) of the phosphor layer 30.

$$AR = D1/W1 \tag{1}$$

In the case where the phosphor layer 30 has different sides (e.g., the width W1 is the long side and the width W2 is the short side), either the width W1 or the width W2 is used. The thickness D1 of the phosphor layer 30 is the distance from the lower surface of the phosphor layer 30 provided on the semiconductor layer 15 to the upper surface of the phosphor layer 30.

The aspect ratio AR satisfies Formula (2).

$$0.02 < AR < 1 \tag{2}$$

For example, when AR≤0.02, the density distribution of the phosphors 31 dispersed in the phosphor layer 30 may become nonuniform; and the shift of the hue may become large. When the thickness is equal to or less than about the diameter of the phosphor particles, the likelihood becomes high that a uniform phosphor resin film cannot be formed.

For example, when 1≤AR, the stress concentrates easily in the phosphor layer 30 which may cause damage of the phosphor layer 30 in the process of forming on the mounting unit. Collapsing of the component which may cause mounting defects occurs easily when mounting.

The chromaticity Ct is expressed by Formula (3) using the chromaticity Cx and the chromaticity Cy.

$$Ct = \pm((Cx)^2 + (Cy)^2)^{1/2} \tag{3}$$

The ± sign of Formula (3) is positive when the chromaticities Cx and Cy are positive, and negative when the chromaticities Cx and Cy are negative.

As shown in FIG. 3A to FIG. 3C, the shift of the hue of the semiconductor light emitting device is small when the values of the chromaticities Cx and Cy are greater than 0.035 but less than 0.035. In other words, from Formula (3), the shift of the hue of the semiconductor light emitting device is small when the value of the chromaticity Ct is greater than −0.05 and less than 0.05.

The different plot configurations inside the graph are classified by the different numbers of phosphors 31 provided inside the phosphor layer 30. The straight lines are linear approximations of the relationships between the chromaticity Ct and the aspect ratio AR of the phosphor layer 30.

The linear approximation of the result plotted using white circles with black outlines is illustrated by the thin solid line. The linear approximation of the result plotted using the solid black triangles is illustrated by the single dot-dash line. The linear approximation of the result plotted using the white quadrilaterals with black outlines is illustrated by the broken line. The linear approximation of the result plotted using the solid black circles is illustrated by the double dot-dash line.

The linear approximation of the result plotted using the solid black quadrilaterals is illustrated by the thick solid line.

The lines show a trend in which the value of the chromaticity Ct decreases and becomes a large negative value as the aspect ratio AR of the phosphor layer 30 increases. In other words, the relationships between the chromaticity Ct and the aspect ratio AR of the phosphor layer 30 have the same trend regardless of the difference between the number of phosphors 31.

In the embodiment, the inventors confirmed the results described above by observing the relative chromaticity for each irradiation angle using an LED light measuring device MCPD 9800 (made by Otsuka Electronics Co., Ltd.).

Based on the measurement results shown in FIG. 4, the chromaticity Ct of the semiconductor light emitting device can be derived by Formula (4) using any aspect ratio AR, any number Np of phosphors 31, and constants A, B, and C.

$$Ct = A \times (AR) + B \times (Np) + C \quad (4)$$

The constants A, B, and C of Formula (4) respectively satisfy the ranges recited below.

$$-0.149055 - (3 \times 0.011797) \leq A \leq -0.149055 + (3 \times 0.011797)$$

$$-0.000192 - (3 \times 0.00002461) \leq B \leq -0.000192 + (3 \times 0.00002461)$$

$$0.0818492 - (3 \times 0.005708) \leq C \leq 0.0818492 + (3 \times 0.005708)$$

The number Np of phosphors 31 is expressed by Formula (5) using a phosphor resin volumce V ($\mu m^3$), the phosphor-resin concentration v (%), and a volumetric particle size r ($\mu m$).

$$Np = V \times v \times 3/(4 \times \pi \times R)$$

$$R = (r/2)^3 \quad (5)$$

For example, X-ray CT is used as a method for determining the phosphor-resin concentration v and the volumetric particle size r of the phosphors 31. In X-ray CT, it is possible to show the structure of the phosphor layer 30 as a three-dimensional image; and the phosphor particles included in the phosphor layer 30 can be illustrated clearly. Accordingly, the phosphor-resin concentration v and the volumetric particle size r can be determined by three-dimensional measurements of the positions of the phosphors 31 by CT scan and by statistical processing of the data. The volumetric particle size r is the median diameter (D50) of the particle size distribution. For example, it is favorable for the number Np of phosphors 31 in Formula (4) to satisfy the range of 0<Np≤3800 (D50=5 μm).

The shift of the hue of the semiconductor light emitting device is small in Formula (4) when Formula (6) is satisfied.

$$-0.05 < Ct < 0.05 \quad (6)$$

In such a case, for example, white light is viewed for the entirety when the semiconductor light emitting device is viewed from the upper surface.

The shift of the hue of the semiconductor light emitting device is large in the case where the chromaticity Ct≥0.05 in Formula (4). In such a case, for example, a ring of yellow light is viewed at the outer edge side when the semiconductor light emitting device is viewed from the upper surface.

In the case where the chromaticity Ct≤−0.05 in Formula (4), the shift of the hue of the semiconductor light emitting device is large. In such a case, for example, a ring of blue light is viewed at the outer edge side when the semiconductor light emitting device is viewed from the upper surface.

It is more favorable for the constants A, B, and C of Formula (4) to respectively satisfy the equalities recited below. Thereby, it is possible to derive the value of the chromaticity Ct with higher precision.

$$A = -0.149055$$

$$B = -0.000192$$

$$C = 0.0818492$$

In the case where the phosphor layer 30 that is used in the aspect ratio AR has multiple long sides and short sides, it is sufficient for either the width W1 of the long side or the width W2 of the short side to satisfy Formula (4).

Figure 5:
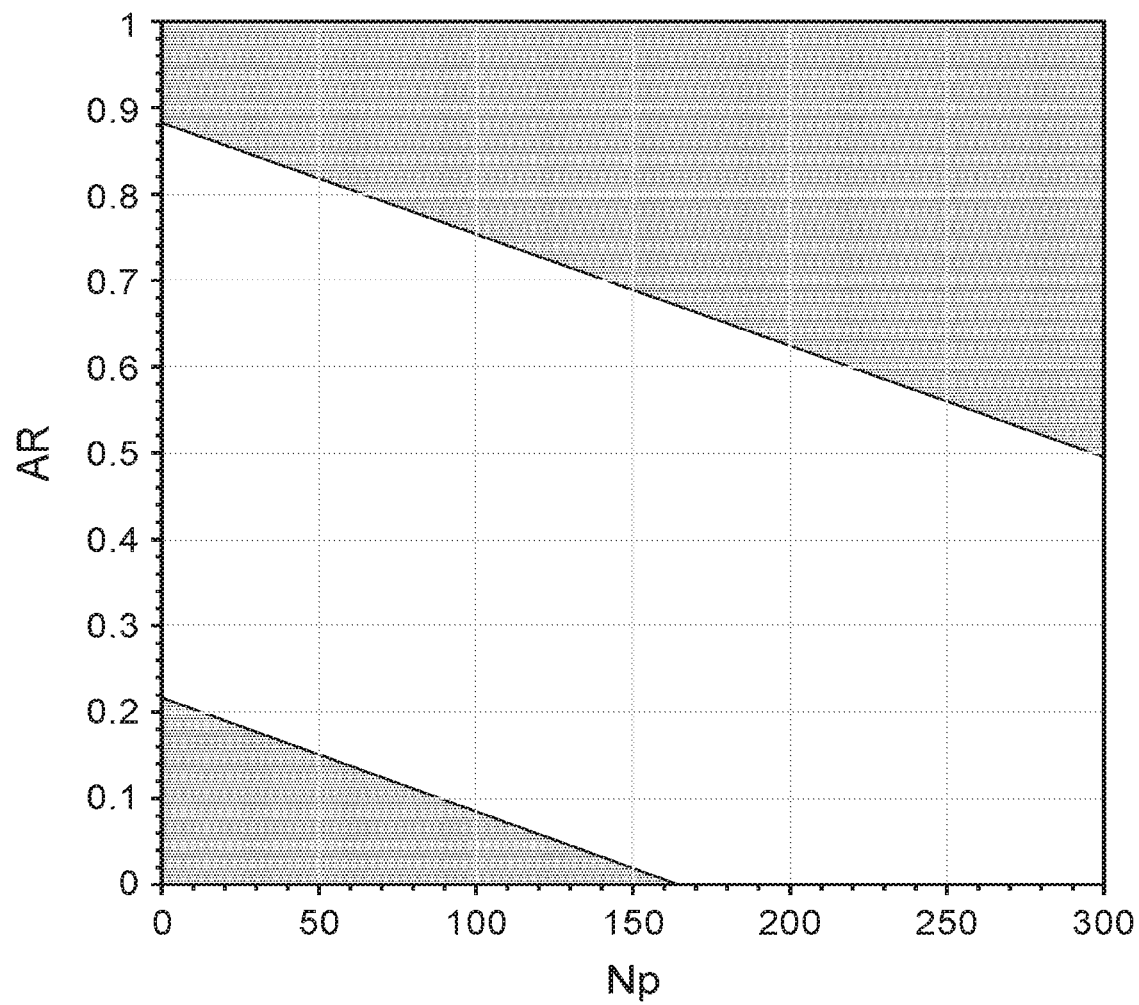
FIG. 5 is a graph of the range of the shift of the hue of the semiconductor light emitting device.

FIG. 5 is a graph of the range of the shift of the hue of the semiconductor light emitting device derived based on FIG. 4.

In FIG. 5, the horizontal axis is the number Np of phosphors 31; and the vertical axis is the aspect ratio AR of the phosphor layer 30.

The solid line on the upper portion side of the graph illustrates the relationship of the aspect ratio AR and the number Np of phosphors 31 in which the chromaticity Ct=−0.05 is satisfied. The region above this solid line (the cross-hatched region of the figure) illustrates the range of the relationship of the aspect ratio AR and the number Np of phosphors 31 in which the chromaticity Ct<−0.05 is satisfied.

In other words, the shift of the hue of the semiconductor light emitting device is large when the relationship between the aspect ratio AR and the number Np of phosphors 31 corresponds to the region at and above the solid line in the upper portion of the graph. In such a case, for example, a ring of blue light is viewed at the outer edge side when the semiconductor light emitting device is viewed from the upper surface.

The solid line on the lower portion of the graph illustrates the relationship of the aspect ratio AR and the number Np of phosphors 31 in which the chromaticity Ct=0.05 is satisfied. The region below this solid line (the cross-hatched region of the figure) illustrates the range of the relationship of the aspect ratio AR and the number Np of phosphors 31 in which the chromaticity Ct>0.05 is satisfied.

In other words, the shift of the hue of the semiconductor light emitting device is large when the relationship between the aspect ratio AR and the number Np of phosphors 31 corresponds to the region at and below the solid line in the lower portion of the graph. In such a case, for example, a ring of yellow light is viewed at the outer edge side when the semiconductor light emitting device is viewed from the upper surface.

The region between the solid lines of the upper portion and the lower portion of the graph is the range of the relationship of the aspect ratio AR and the number Np of phosphors 31 in which −0.05<chromaticity Ct<0.05 is satisfied.

In other words, the shift of the hue of the semiconductor light emitting device is small when the relationship between the aspect ratio AR and the number Np of phosphors 31 corresponds to the region between the solid line of the upper portion and the solid line of the lower portion of the graph. In such a case, for example, white light is viewed for the entirety when the semiconductor light emitting device is viewed from the upper surface.

According to the embodiment, it is possible to derive the chromaticity Ct from Formula (4) using the aspect ratio AR and the number Np of phosphors 31. Thereby, the value of the chromaticity Ct of the semiconductor light emitting device can be set so that −0.05<Ct<0.05. In other words, the shift of the chromaticity Ct can be suppressed; and it is possible to provide a semiconductor light emitting device having excellent optical characteristics.

Further, by narrowing the range of the constants A, B, and C used in Formula (4), the precision of the value of the derived chromaticity Ct can be increased. Thereby, it is possible to provide a semiconductor light emitting device having more excellent optical characteristics.

In addition to the description recited above, for example, the planar size of the phosphor layer 30 is larger than the planar size of the semiconductor layer 15. The side surface of the semiconductor layer 15 is covered with the insulating film 18; and the phosphor layer 30 is provided to be continuous on the semiconductor layer 15 and on the insulating film 18. Thereby, the light that is emitted from the side surface of the semiconductor layer 15 can be suppressed; and it is possible to provide a semiconductor light emitting device having more excellent optical characteristics.

The reflective film 51 is provided on the side surface of the semiconductor layer 15 with the insulating film 18 interposed. Thereby, the light that is emitted from the side surface of the semiconductor layer 15 can be suppressed further; and it is possible to provide a semiconductor light emitting device having more excellent optical characteristics.

For example, the insulating layer 19 is provided between the phosphor layer 30 and the semiconductor layer 15. Thereby, the adhesion between the phosphor layer 30 and the semiconductor layer 15 can be increased. Therefore, the attenuation of the light radiated from the semiconductor layer 15 into the phosphor layer 30 can be suppressed; and it is possible to provide a semiconductor light emitting device having more excellent optical characteristics.

Semiconductor light emitting devices that have different configurations of the phosphor layer 30 and the semiconductor layer 15 will now be described with reference to FIG. 6A to FIG. 6C.

Figure 6A:
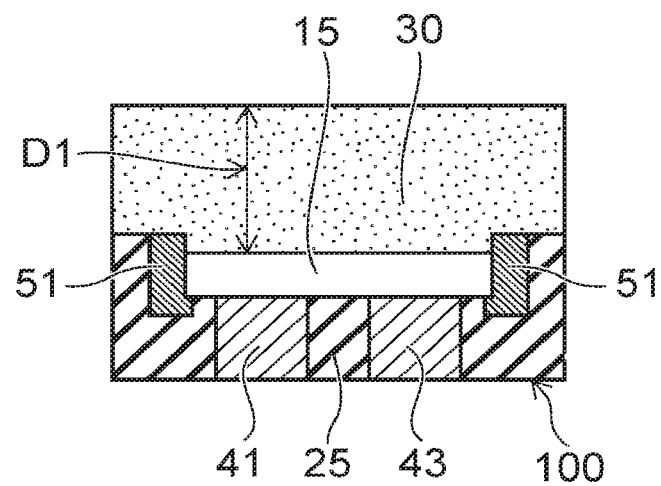
FIG. 6A to FIG. 6C are schematic cross-sectional views of the semiconductor light emitting device of the embodiment.
Figure 6B:
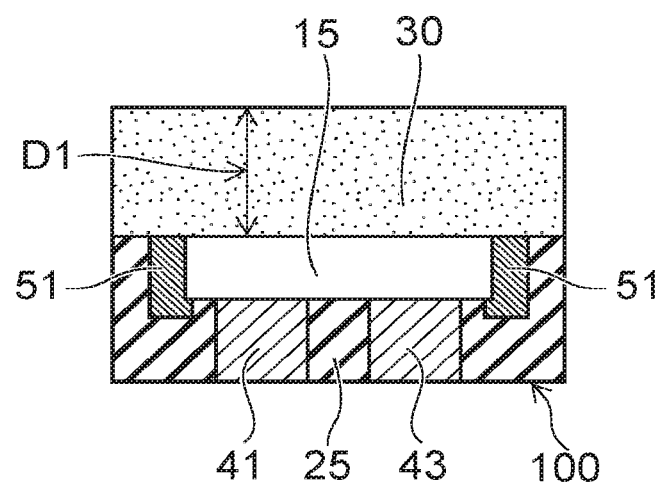
Figure 6C:
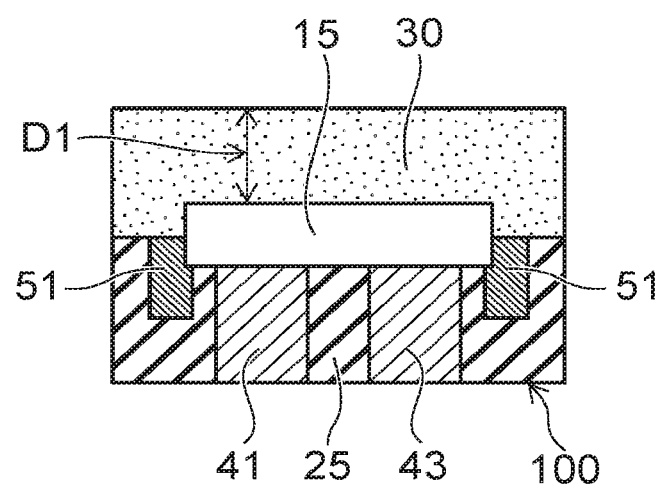

FIG. 6A to FIG. 6C are schematic cross-sectional views of the semiconductor light emitting devices of the embodiment.

FIG. 6A to FIG. 6C show examples of the semiconductor light emitting devices having different configurations of the semiconductor layer 15 and the phosphor layer 30. The detailed configurations of the semiconductor light emitting devices are similar to the configuration shown in FIG. 1, and a description is therefore partially omitted. Illustrations other than the semiconductor layer 15 and the phosphor layer 30 also are partially omitted.

As shown in FIG. 6A, the upper surface of the semiconductor layer 15 is provided to be lower than the upper surface of the support body 100. Therefore, the thickness of the phosphor layer 30 on the semiconductor layer 15 is thicker than the thickness of the phosphor layer 30 on the support body 100.

For example, in the method for forming the structure recited above, the growth substrate of the semiconductor layer 15 is etched simultaneously when etching the semiconductor layer 15. Then, the support body 100 is formed; and the growth substrate is removed. Subsequently, the surface that was in contact with the growth substrate of the semiconductor layer 15 is formed by frosting.

As shown in FIG. 6B, the upper surface of the semiconductor layer 15 is coplanar with the upper surface of the support body 100. Therefore, the thickness of the phosphor layer 30 on the semiconductor layer 15 is equal to the thickness of the phosphor layer 30 on the support body 100.

For example, in the method for forming the structure recited above, the growth substrate is not etched when etching the semiconductor layer 15. Then, the support body 100 is formed; and the growth substrate is removed.

As shown in FIG. 6C, the upper surface of the semiconductor layer 15 is provided to be higher than the upper surface of the support body 100. Therefore, the thickness of the phosphor layer 30 on the semiconductor layer 15 is thinner than the thickness of the phosphor layer 30 on the support body 100.

For example, in the method for forming the structure recited above, the etching ends before reaching the growth substrate when etching the semiconductor layer 15. Then, the support body 100 is formed; and the growth substrate is removed. Subsequently, the surface that was in contact with the growth substrate of the semiconductor layer 15 is formed by frosting.

In each of the configurations shown in FIG. 6A to FIG. 6C as well, it is possible to derive the chromaticity Ct using Formula (4). Thereby, the value of the chromaticity Ct of the semiconductor light emitting device can be set so that −0.05<Ct<0.05. In other words, the shift of the chromaticity Ct can be suppressed; and it is possible to provide a semiconductor light emitting device having excellent optical characteristics. In each of the configurations shown in FIG. 6A to FIG. 6C as well, the thickness D1 of the phosphor layer 30 is the distance from the lower surface of the phosphor layer 30 provided on the semiconductor layer 15 to the upper surface of the phosphor layer 30.

Semiconductor light emitting devices of other embodiments will now be described with reference to FIG. 7A to FIG. 7C.

Figure 7A:
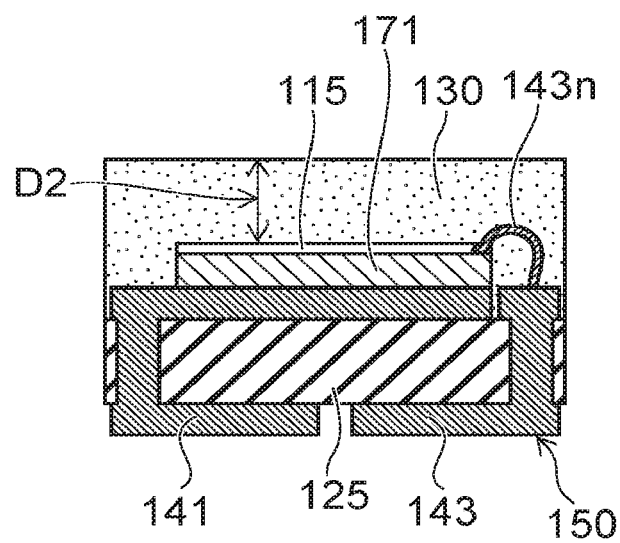
FIG. 7A to FIG. 7C are schematic cross-sectional views of the semiconductor light emitting device of another embodiment.
Figure 7B:
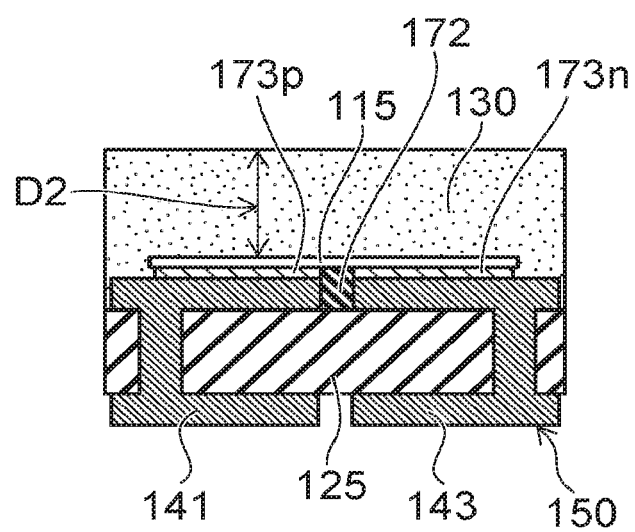
Figure 7C:
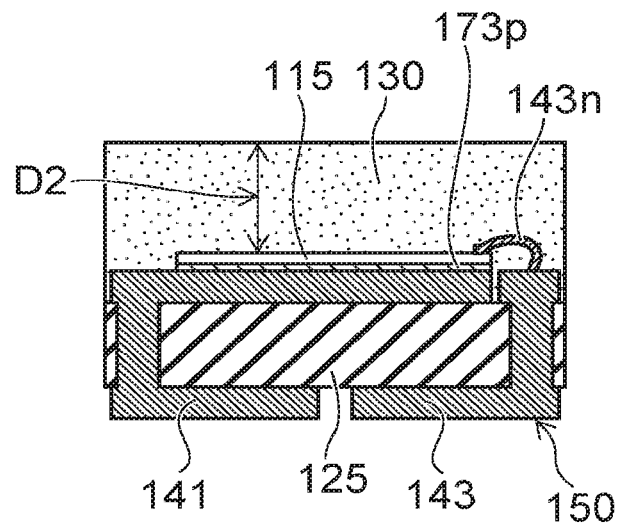

FIG. 7A to FIG. 7C are schematic cross-sectional views of the semiconductor light emitting devices of the other embodiments.

FIG. 7A to FIG. 7C show examples of semiconductor light emitting devices having different configurations of a mounting unit 150. A description is omitted for configurations similar to those of the embodiment described above.

As shown in FIG. 7A, a semiconductor layer 115 is provided on the mounting unit 150 with a support substrate 171 interposed. A phosphor layer 130 is provided as one body on the mounting unit 150 and on the semiconductor layer 115.

The semiconductor layer 115 is electrically connected via an interconnect 143n to an n-side interconnect unit 143 that includes the mounting unit 150. The semiconductor layer 115 is electrically connected via the support substrate 171 to a p-side interconnect unit 141 that includes the mounting unit 150.

For example, in the method for forming the structure recited above, the support substrate 171 is formed on the mounting unit 150; and the semiconductor layer 115 is formed on the support substrate 171. Subsequently, the interconnect 143n that electrically connects the semiconductor layer 115 to the n-side interconnect unit 143 is formed.

As shown in FIG. 7B, the semiconductor layer 115 is provided on the mounting unit 150 with metal layers 173p and 173n interposed. The metal layer 173p is separated from the metal layer 173n. The phosphor layer 130 is provided as one body on the mounting unit 150 and on the semiconductor layer 115.

The semiconductor layer 115 is electrically connected via the metal layer 173n to the n-side interconnect unit 143 that includes the mounting unit 150. The semiconductor layer 115 is electrically connected via the metal layer 173p to the p-side interconnect unit 141 that includes the mounting unit 150.

For example, in the method for forming the structure recited above, the semiconductor layer 115 is formed on a not-shown growth substrate using epitaxial growth. Then, the upper surface of the semiconductor layer 115 is connected to the mounting unit 150 via the metal layers 173p and 173n. Subsequently, for example, the growth substrate is removed from the semiconductor layer 115 using laser lift-off.

As shown in FIG. 7C, the semiconductor layer 115 is provided on the mounting unit 150 with the metal layer 173p interposed. The phosphor layer 130 is provided as one body on the mounting unit 150 and on the semiconductor layer 115.

The semiconductor layer 115 is electrically connected via the interconnect 143n to the n-side interconnect unit 143 that includes the mounting unit 150. The semiconductor layer 115 is electrically connected via the metal layer 173p to the p-side interconnect unit 141 that includes the mounting unit 150.

For example, in the method for forming the structure recited above, the metal layer 173p is formed on the mounting unit 150; and the semiconductor layer 115 is formed on the metal layer 173p. Subsequently, the interconnect 143n that electrically connects the semiconductor layer 115 to the n-side interconnect unit 143 is formed.

In each of the structures shown in FIG. 7A to FIG. 7C as well, similarly to the embodiment described above, it is possible to derive the chromaticity Ct from Formula (4). Thereby, the value of the chromaticity Ct of the semiconductor light emitting device can be set so that $-0.05 < Ct < 0.05$. In other words, the shift of the chromaticity Ct can be suppressed; and it is possible to provide a semiconductor light emitting device having excellent optical characteristics. In each of the configurations shown in FIG. 7A to FIG. 7C as well, a thickness D2 of the phosphor layer 30 is the distance from the lower surface of the phosphor layer 130 provided on the semiconductor layer 115 to the upper surface of the phosphor layer 130.

The precision of the value of the derived chromaticity Ct can be increased by narrowing the range of the constants A, B, and C used in Formula (4). Thereby, it is possible to provide a semiconductor light emitting device having more excellent optical characteristics.

For example, the insulating layer 19 is provided between the phosphor layer 130 and the semiconductor layer 115. Thereby, the adhesion between the phosphor layer 130 and the semiconductor layer 115 can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
    a semiconductor layercomprising a light emitting layer; and
    a phosphor layer provided on the semiconductor layer, the phosphor layer comprising a plurality of phosphors, $-0.05 < A \times (AR) + B \times (Np) + C < 0.05$ being satisfied for
    $-0.149055 - (3 \times 0.011797) \le$ constant $A \le -0.149055 + (3 \times 0.011797)$,
    $-0.000192 - (3 \times 0.00002461) \le$ constant $B \le -0.000192 + (3 \times 0.00002461)$, and
    $0.0818492 - (3 \times 0.005708) \le$ constant $C \le 0.0818492 + (3 \times 0.005708)$, where
    AR is a ratio of a thickness of the phosphor layer to a width of the phosphor layer and $0.02 < AR < 1$, and
    Np is a number of the plurality of phosphors, and $0 < Np \le 3800$.

2. The device according to claim 1, wherein the width of the phosphor layer is one of a long side or a short side of the phosphor layer.

3. The device according to claim 1, wherein the constant A, the constant B, and the constant C respectively satisfy
    $A = -0.149055$,
    $B = -0.000192$, and
    $C = 0.0818492$.

4. The device according to claim 1, wherein a planar size of the phosphor layer is larger than a planar size of the semiconductor layer.

5. The device according to claim 1, further comprising a metal film provided at a side surface of the semiconductor layer.

6. The device according to claim 5, further comprising an insulating film provided between the semiconductor layer and the metal film.

7. The device according to claim 1, further comprising a transparent layer provided between the phosphor layer and the semiconductor layer.

8. The device according to claim 7, wherein a thickness of the transparent layer is more than 0 μm but not more than 10 μm.

9. The device according to claim 1, wherein the phosphor layer comprises a binder, the plurality of phosphors being dispersed in the binder.

10. The device according to claim 9, wherein the binder comprises a silicone resin.

11. The device according to claim 1, wherein the width of the phosphor layer is not less than 10 μm and not more than 30 μm.

12. The device according to claim 1, further comprising:
    a p-side electrode provided on the semiconductor layer;
    an n-side electrode provided on the semiconductor layer; and
    a support body supporting the semiconductor layer, the p-side electrode, and the n-side electrode.

13. The device according to claim 12, wherein the semiconductor layer is provided between the phosphor layer and the support body.

14. The device according to claim 12, wherein a side surface of the phosphor layer is aligned with a side surface of the support body.

15. The device according to claim 12, wherein the phosphor layer is provided on the semiconductor layer and on the support body to be continuous from the semiconductor layer to the support body.

16. The device according to claim 12, wherein a thickness of the phosphor layer on the semiconductor layer is thicker than a thickness of the phosphor layer on the support body.

17. The device according to claim 12, wherein a thickness of the phosphor layer on the semiconductor layer is thinner than a thickness of the phosphor layer on the support body.

18. The device according to claim 12, wherein an upper surface of the semiconductor layer is coplanar with an upper surface of the support body.

\* \* \* \* \*